(12) United States Patent
Inoue et al.

(10) Patent No.: US 7,112,912 B2
(45) Date of Patent: Sep. 26, 2006

(54) SURFACE ACOUSTIC WAVE DEVICE AND BRANCHING FILTER

(75) Inventors: Kenji Inoue, Tokyo (JP); Seisuke Mochizuka, Tokyo (JP)

(73) Assignee: TDK Corporation, Tokyo (JP)

( * ) Notice: Subject to any disclaimer, the term of this patent is extended or adjusted under 35 U.S.C. 154(b) by 158 days.

(21) Appl. No.: 10/800,649

(22) Filed: Mar. 16, 2004

(65) Prior Publication Data

US 2005/0206272 A1    Sep. 22, 2005

(51) Int. Cl.
*H01L 41/08* (2006.01)
(52) U.S. Cl. .............................. 310/313 B; 310/313 R; 310/313 D
(58) Field of Classification Search ............ 310/313 R, 310/313 B, 313 C, 313 D; 333/193–196
See application file for complete search history.

(56) References Cited

U.S. PATENT DOCUMENTS

| | | | |
|---|---|---|---|
| 6,268,782 B1 * | 7/2001 | Hartmann et al. | 333/193 |
| 6,747,530 B1 * | 6/2004 | Selmeier | 333/193 |
| 6,882,249 B1 * | 4/2005 | Takamine et al. | 333/193 |
| 6,903,631 B1 * | 6/2005 | Kushitani et al. | 333/193 |
| 6,963,156 B1 * | 11/2005 | Shibahara et al. | 310/313 D |

FOREIGN PATENT DOCUMENTS

| | | |
|---|---|---|
| JP | 5-48055 | 2/1993 |
| JP | 6-260876 | 9/1994 |

OTHER PUBLICATIONS

"Danseisoshi Gijutu Handobukku (Handbook of Elastic Component Technology)", OHMSHA, Ltd., Nov. 30, 1991, pp. 216-227.

* cited by examiner

*Primary Examiner*—Mark Budd
(74) *Attorney, Agent, or Firm*—Oblon, Spivak, McClelland, Maier & Neustadt, P.C.

(57) ABSTRACT

A surface acoustic wave device is provided with an input signal electrode 15 and an output signal electrode 16 to and from which an electric signal is inputted or outputted; a first surface acoustic wave resonator 18 including an input terminal 18a connected to the input signal electrode 15 and having a plurality of comb electrodes, an output terminal 18b connected to the output signal electrode 16 and having a plurality of comb electrodes, a common terminal 18c which has a plurality of comb electrodes and which forms interdigital transducers A and B together with the comb electrodes of the input terminal 18a and the comb electrodes of the output terminal 18b; and a second surface acoustic wave resonator 19 connected between the common terminal 18c of the first surface acoustic wave resonator 18 and a pair of grounding terminals 17.

8 Claims, 13 Drawing Sheets

λa  λb

SURFACE ACOUSTIC WAVE DEVICE AND BRANCHING FILTER

BACKGROUND OF THE INVENTION

The present invention relates to a surface acoustic wave device and a branching filter.

In recent years, rapid development has been made in mobile communication terminals including portable telephones. It is desired that these terminals be particularly lightweight for ease of handling and portability.

To realize compact and lightweight mobile communication terminals, it is essential that electronic parts used therein be also compact and lightweight. For this reason, surface acoustic wave devices, i.e., surface acoustic wave filters, which are advantageous in making them compact and lightweight, are widely used.

As important characteristics required for the surface acoustic wave filters, it is arisen the insertion loss and the spurious response attenuation. The insertion loss affect power consumption of the apparatus, and the lower the loss, the more the battery life is prolonged, so that the battery capacity can be reduced, contributing to the compact and lightweight apparatus. In addition, if high spurious response attenuation can be obtained by a single surface acoustic wave filter, it contributes to the compact and lightweight apparatus.

Conventional surface acoustic wave filters will be described below.

As a filter which satisfies low loss and high attenuation characteristics, it is possible to cite a ladder-type filter.

In the ladder-type filter, a surface acoustic wave resonator connected in series to input and output signal electrodes and a surface acoustic wave resonator connected in parallel thereto are set as one section, and a plurality of such sections are cascade connected. Since these ladder-type filters excel in the low loss and the attenuation of a vicinity of a passband, they are widely used as high-frequency filters of portable telephones.

However, as for the ladder-type filter, if a surface acoustic wave resonator connected in series to input and output signal electrodes and a surface acoustic wave resonator connected in parallel thereto are set as one section, it is difficult to satisfy the required characteristics if only this one section is used. Therefore, it is necessary to use a plurality of sections by cascade connecting them. For example, in a reception-side filter of a branching filter for W-CDMA, it is necessary to use at least seven surface acoustic wave resonators. For that reason, there is a problem in that the chip size increases, and runs counter to the demand for the compact size.

In addition, since the surface acoustic wave resonator needs to be disposed at a position where it does not interfere with the other surface acoustic wave resonators, a long connection line is required to effect predetermined electrical connection. The loss attributable to this connection line becomes such a large problem that it cannot be ignored.

SUMMARY OF THE INVENTION

Accordingly, an object of the invention is to provide a surface acoustic wave device which makes it possible to obtain low loss and high attenuation characteristics, while reducing the number of surface acoustic wave resonators used.

To overcome the above-described problems, the surface acoustic wave device in accordance with the invention is characterized by comprising: an input signal electrode and an output signal electrode to and from which an electric signal is inputted or outputted; a first surface acoustic wave resonator including an input terminal connected to the input signal electrode and having a plurality of comb electrodes, an output terminal connected to the output signal electrode and having a plurality of comb electrodes, a first common terminal which has a plurality of comb electrodes and some comb electrodes of which form an interdigital transducer together with the comb electrodes of the input terminal, and a second common terminal which has a plurality of comb electrodes and some comb electrodes of which form an interdigital transducer together with the comb electrodes of the output terminal; and a second surface acoustic wave resonator connected between a grounding electrode and at least one of the common terminals of the first surface acoustic wave resonator.

In addition, to overcome the above-described problems, the surface acoustic wave device in accordance with the invention is characterized by comprising: an input signal electrode and an output signal electrode to and from which an electric signal is inputted or outputted; a third surface acoustic wave resonator connected between the input signal electrode and the output signal electrode; and a fourth surface acoustic wave resonator including a plurality of signal-side terminals having a plurality of comb electrodes and connected to a midpoint between the input signal electrode and the third surface acoustic wave resonator and a midpoint between the output signal electrode and the third surface acoustic wave resonator, and a ground-side terminal having a plurality of comb electrodes to form interdigital transducers by the comb electrodes and the comb electrodes of the plurality of signal-side terminals and connected to a grounding electrode.

Furthermore, to overcome the above-described problems, the surface acoustic wave device in accordance with the invention is characterized by comprising: an input signal electrode and an output signal electrode to and from which an electric signal is inputted or outputted; a plurality of third surface acoustic wave resonators connected in series between the input signal electrode and the output signal electrode; and a fourth surface acoustic wave resonator including a plurality of signal-side terminals having a plurality of comb electrodes and connected to a midpoint between the input signal electrode and the third surface acoustic wave resonator, a midpoint between the output signal electrode and the third surface acoustic wave resonator, and a midpoint between adjacent ones of the third surface acoustic wave resonators, and a ground-side terminal having a plurality of comb electrodes to form interdigital transducers by the comb electrodes and the comb electrodes of the plurality of signal-side terminals and connected to a grounding electrode.

According to the above-described invention, it becomes possible to obtain low loss and high attenuation characteristics, while reducing the number of surface acoustic wave resonators used.

DETAILED DESCRIPTION OF THE PREFERRED EMBODIMENTS

Figure 1:
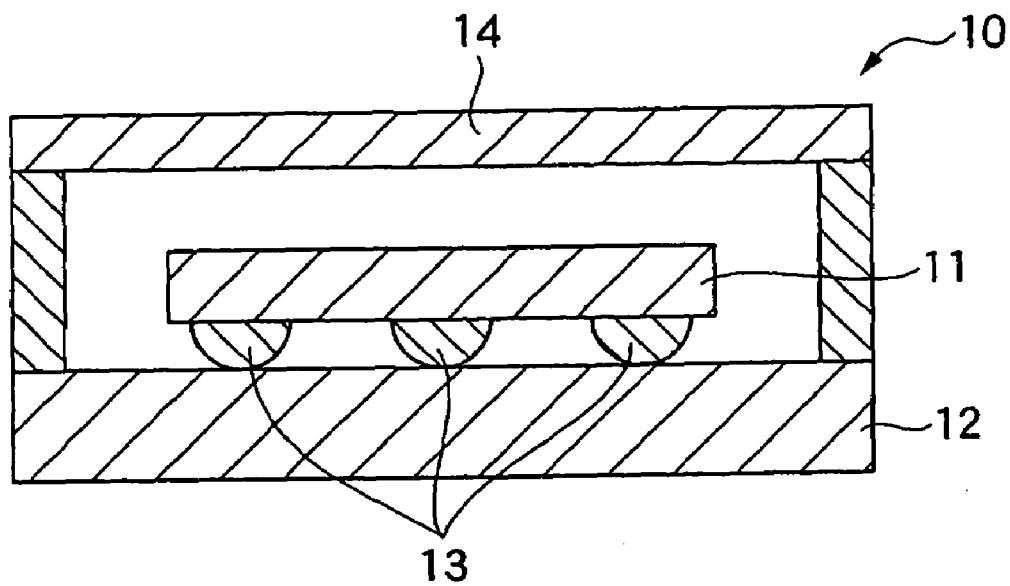
FIG. 1 is a cross-sectional view illustrating an electronic part in which a surface acoustic wave device in accordance with a first embodiment of the invention has been packaged.

Hereafter, a description will be given more specifically of the embodiments of the invention with reference to the drawings. In the appended drawings, identical members are denoted by the same reference numerals, and repetition descriptions are omitted. It should be noted that the embodiments of the invention are forms which are particularly useful when the invention is carried out, and the invention is not limited to its embodiments.

(First Embodiment)

Figure 2:
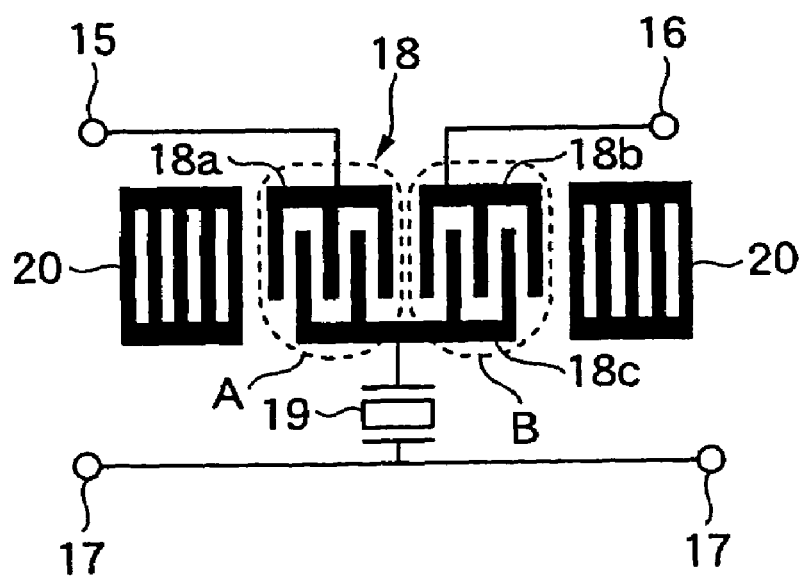
FIG. 2 is a circuit diagram illustrating an equivalent circuit of the surface acoustic wave device in accordance with a first embodiment of the invention.
Figure 3:
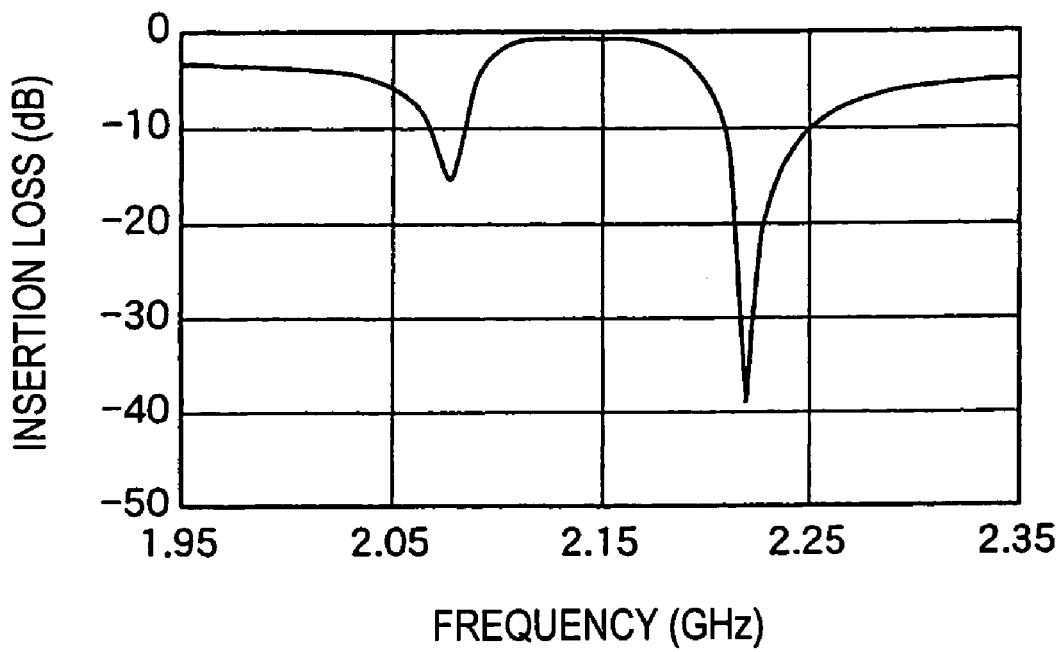
FIG. 3 is a graph illustrating the frequency characteristic of the surface acoustic wave device shown in FIG. 3.
Figure 4:
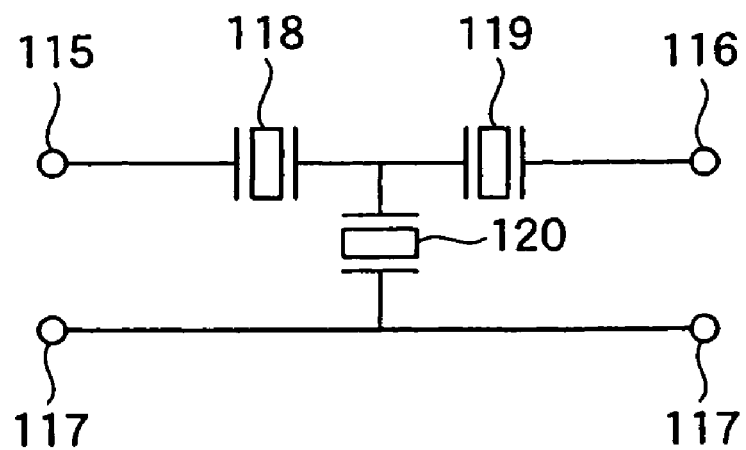
FIG. 4 is a circuit diagram illustrating an equivalent circuit of a surface acoustic wave device as a first object of consideration by the present inventors.
Figure 5:
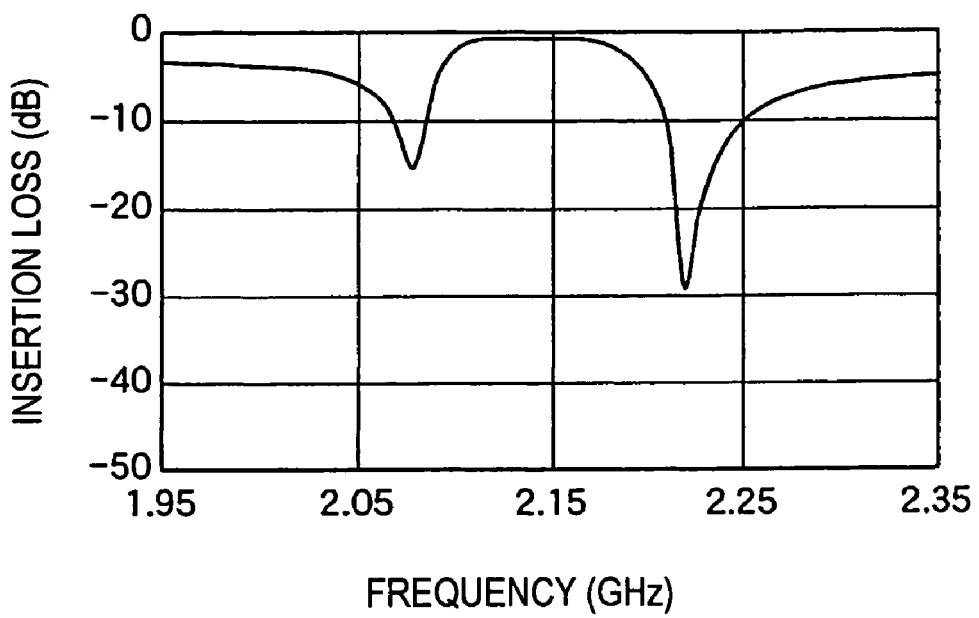
FIG. 5 is a graph illustrating the frequency characteristic of the surface acoustic wave device shown in FIG. 4.

FIG. 1 is a cross-sectional view illustrating an electronic part in which a surface acoustic wave device in accordance with a first embodiment of the invention has been packaged. FIG. 2 is a circuit diagram illustrating an equivalent circuit of the surface acoustic wave device in accordance with a first embodiment of the invention. FIG. 3 is a graph illustrating the frequency characteristic of the surface acoustic wave device shown in FIG. 3. FIG. 4 is a circuit diagram illustrating an equivalent circuit of a surface acoustic wave device as a first object of consideration by the present inventors. FIG. 5 is a graph illustrating the frequency characteristic of the surface acoustic wave device shown in FIG. 4.

In an electronic part 10 shown in FIG. 1, a surface acoustic wave device 11, in which a predetermined conductive pattern has been formed on a piezoelectric substrate (e.g., 39° rotated, Y-cut, X-propagated $LiTaO_3$ piezoelectric substrate), is mounted on a ceramic-made or resin-made mounting substrate 12 which consists of a single layer or a multiple layer and on which a predetermined wiring pattern or a circuit pattern has been formed. Further, the pattern forming surface in the piezoelectric substrate is disposed in face-to-face relation to the mounting surface of the mounting substrate 12, and the surface acoustic wave device 11 and the mounting substrate 12 are flip-chip connected via bumps 13. It should be noted that the two members may be wire-connected by a wire bonding technique.

Here, the piezoelectric substrate is formed by a piezoelectric single crystal of such as $LiNbO_3$, $LiTaO_3$, or crystal, or a piezoelectric ceramic such as a lead zirconate titanate based piezoelectric ceramic. However, a piezoelectric substrate in which a piezoelectric thin film such as a ZnO thin film has been formed on an insulating substrate may be used as the piezoelectric substrate.

Further, a cap 14 is bonded to the mounting substrate in such a manner as to surround the surface acoustic wave device 11, and protects the surface acoustic wave device 11 from such as dust and mechanical shocks.

In the surface acoustic wave device 11, as shown in FIG. 2, formed on the piezoelectric substrate are an input signal electrode 15 and an output signal electrode 16, to and from which an electric signal is inputted or outputted; a pair of grounding electrodes 17 which are set at ground potential; and a first surface acoustic wave resonator 18 and a second surface acoustic wave resonator 19 which resonate with the surface acoustic wave of a predetermined frequency.

Here, the first surface acoustic wave resonator 18 consists of an input terminal 18a connected to the input signal electrode 15 and having a plurality of comb electrodes, an output terminal 18b connected to the output signal electrode 16 and having a plurality of comb electrodes, and a common terminal (first and second common terminals) 18c having a plurality of comb electrodes. Further, one interdigital transducer A is formed by some comb electrodes of the common terminal 18c and the comb electrodes of the input terminal 18a, while one interdigital transducer B is formed by the other comb electrodes of the common terminal 18c and the comb electrodes of the output terminal 18b. It should be noted that reflectors 20 for reflecting the surface acoustic wave are respectively disposed on both sides of the first surface acoustic wave resonator 18 and the second surface acoustic wave resonator 19 (the reflectors on the second surface acoustic wave resonator 19 side are not shown).

The second surface acoustic wave resonator 19 is connected between the common terminal 18c of the above-described first surface acoustic wave resonator 18 and the grounding electrodes 17.

Further, a setting is provided such that the antiresonant frequency of the second surface acoustic wave resonator 19 substantially agrees with the resonant frequency of the first surface acoustic wave resonator 18.

It should be noted that the number of electrodes and the aperture width of each interdigital transducer making up the second surface acoustic wave resonator can be set freely, including the description that follows.

In addition, although electrode periods and the numbers of pairs of the interdigital transducers of the first surface acoustic wave resonator are set to identical values in this embodiment, different electrode periods and different numbers of pairs may be used. Further, the aperture width need not completely agree, and may be different.

Figure 6:
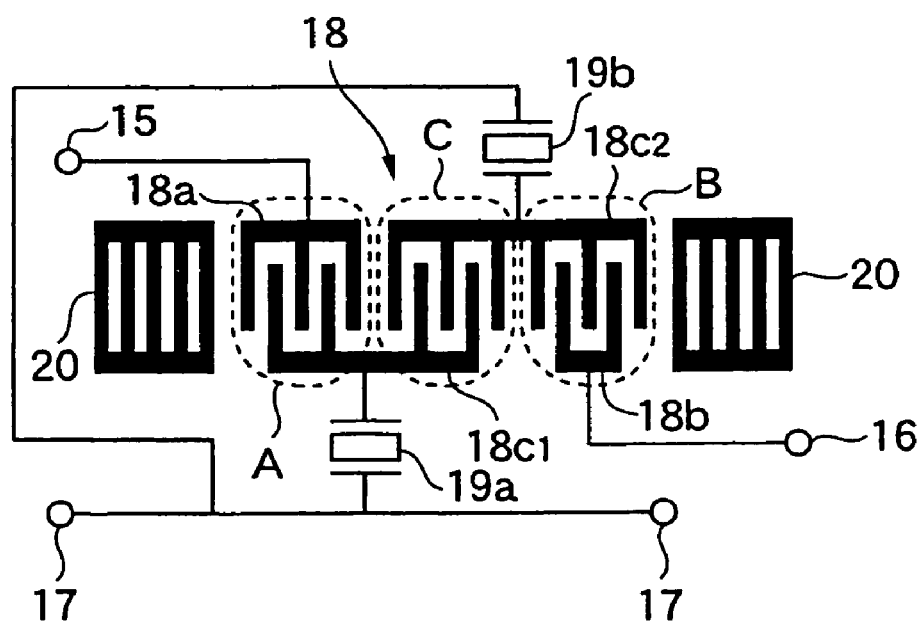
FIG. 6 is a circuit diagram illustrating an equivalent circuit of the surface acoustic wave device in accordance with a second embodiment of the invention.
Figure 12:
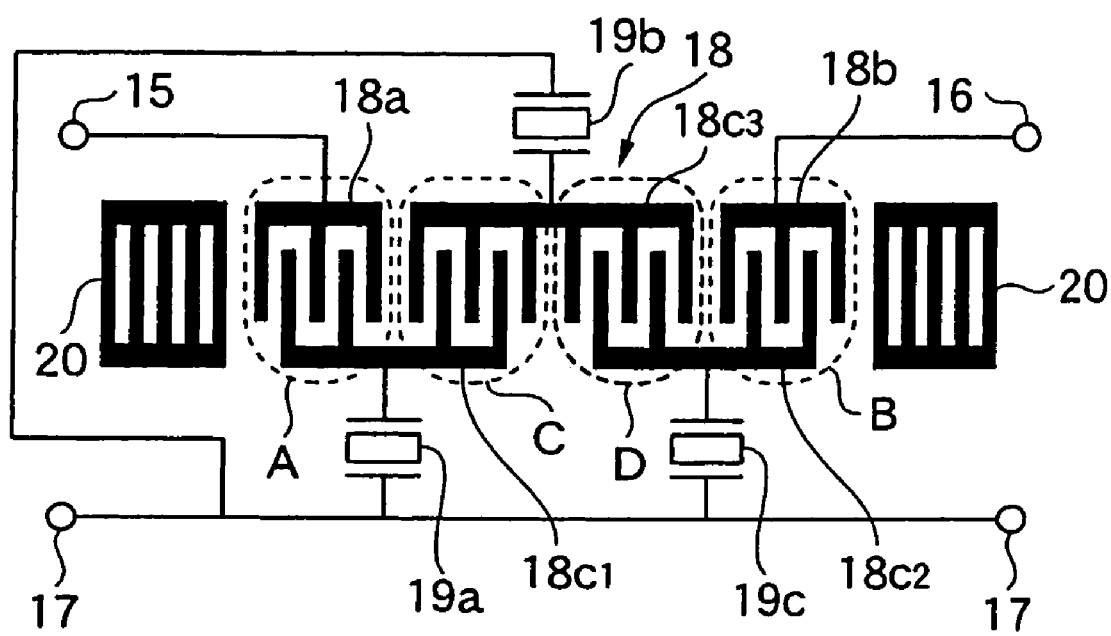
FIG. 12 is a circuit diagram illustrating an equivalent circuit of the surface acoustic wave device as a modification of the second embodiment of the invention.
Figure 22:
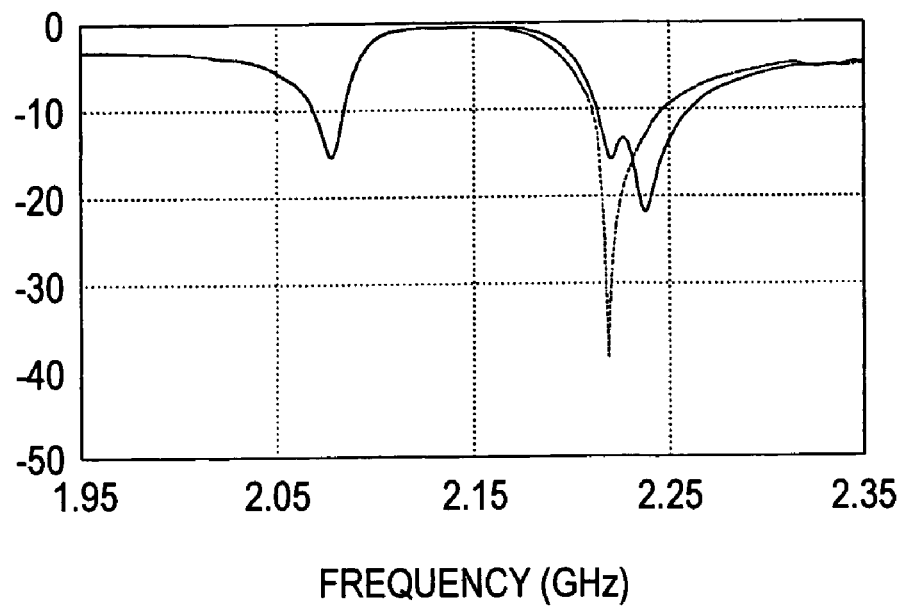
FIG. 22 is a frequency characteristic of the surface acoustic wave device if electrode periods are made different in the case of FIG. 2.
Figure 24:
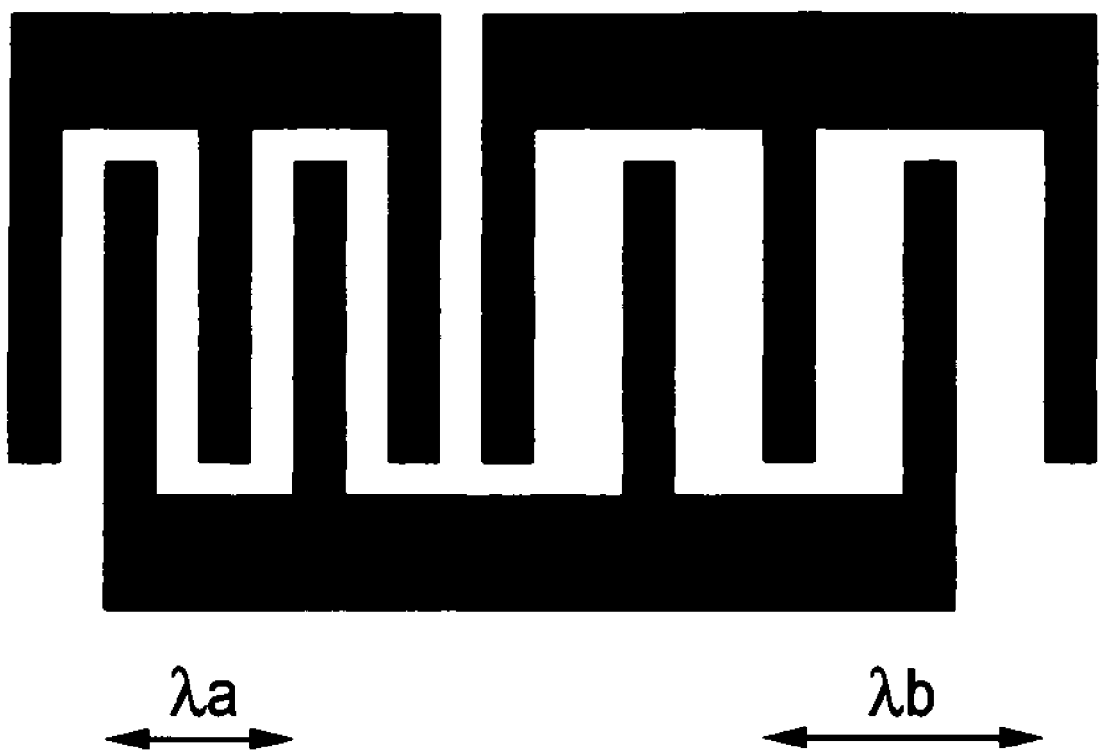
FIG. 24 is a diagram showing that electrode periods are made different.

For example, in FIG. 2, if a electrode period of the interdigital transducer B is made different from a electrode period of the interdigital transducer A (see FIG. 24), passing band can be widened. FIG. 22 shows a frequency characteristic of the surface acoustic wave device in that an electrode period of the interdigital transducer A is set to λ and an electrode period of the interdigital transducer B is set to 0.99λ (or 1.01λ). In FIG. 22, a broken line indicates a frequency characteristic when both electrode periodes of the transducers A and B are identical each other. As apparent from FIG. 22, it is preferable that the passing band is widened at high frequency side when the electrode periodes are differentiated. The difference of electrode periodes is appropriately adjustable in accordance with necessitated characteristic. The ratio of the period is not limited to 0.99 or 1.01. In the case of three or more interdigital transducers are arranged as shown in FIG. 6 or 12, it is clearly understandable that the electrode period can be independently set irrespective of the others.

Furthermore, the electrode periods may be alternately identical or different in relationship with the interdigital transducers making up the second surface acoustic wave resonator, or any ones of the electrode periods may be identical. However, to obtain desirable frequency characteristics, the electrode period of the interdigital transducers making up the second surface acoustic wave resonator is preferably set to be greater than the electrode period of the interdigital transducers making up the first surface acoustic wave resonator.

The frequency characteristic of the surface acoustic wave device having the above-described configuration is shown in FIG. 3.

Here, an equivalent circuit of a surface acoustic wave device as a first object of consideration by the present inventors is shown in FIG. 4.

FIG. 4 is a surface acoustic wave device of a so-called ladder type. Two surface acoustic wave resonators 118 and 119 are connected in series between an input signal electrode 115 and an output signal electrode 116. Further, one surface acoustic wave resonator 120 is connected between a midpoint between these surface acoustic wave resonators 118 and 119 and a pair of grounding electrodes 117. Namely, a total of three surface acoustic wave resonators are used in the illustrated case. Further, a setting is provided such that the antiresonant frequency of the second surface acoustic wave resonator 120 substantially agrees with the resonant frequencies of the surface acoustic wave resonators 118 and 119.

The frequency characteristic of the surface acoustic wave device having the configuration of FIG. 4 is shown in FIG. 5.

As can be understood through a comparison between the frequency characteristic (FIG. 3) of the surface acoustic wave device of this embodiment and the frequency characteristic (FIG. 5) of the surface acoustic wave device which is the first object of consideration, the insertion losses and the attenuation characteristics of the two devices are substantially equivalent.

As described before, only two surface acoustic wave resonators including the first surface acoustic wave resonator 18 and the second surface acoustic wave resonator 19 are used in the surface acoustic wave device of this embodiment. In contrast, three surface acoustic wave resonators are used in the surface acoustic wave device which is the first object of consideration.

Thus, in accordance with the invention, in the first surface acoustic wave resonator 18, the input terminal 18a and the output terminal 18b having the plurality of comb electrodes are respectively connected to the input signal electrode 15 and the output signal electrode 16. Furthermore, the surface acoustic wave resonator 19 is connected between the grounding electrodes 17, on the one hand, and the common terminal 18c, on the other hand, which makes up the interdigital transducers together with the comb electrodes of the input terminal 18a and the comb electrodes of the output terminal 18b. Therefore, the number of surface acoustic wave resonators required can be reduced, and the connection line length necessary for electrical connection can be made short. Hence, it is possible to obtain frequency characteristics of low loss and high attenuation characteristics, while reducing the number of surface acoustic wave resonators used.

As a result, it is possible to make the chip size small and make the device compact.

(Second Embodiment)

Figure 7:
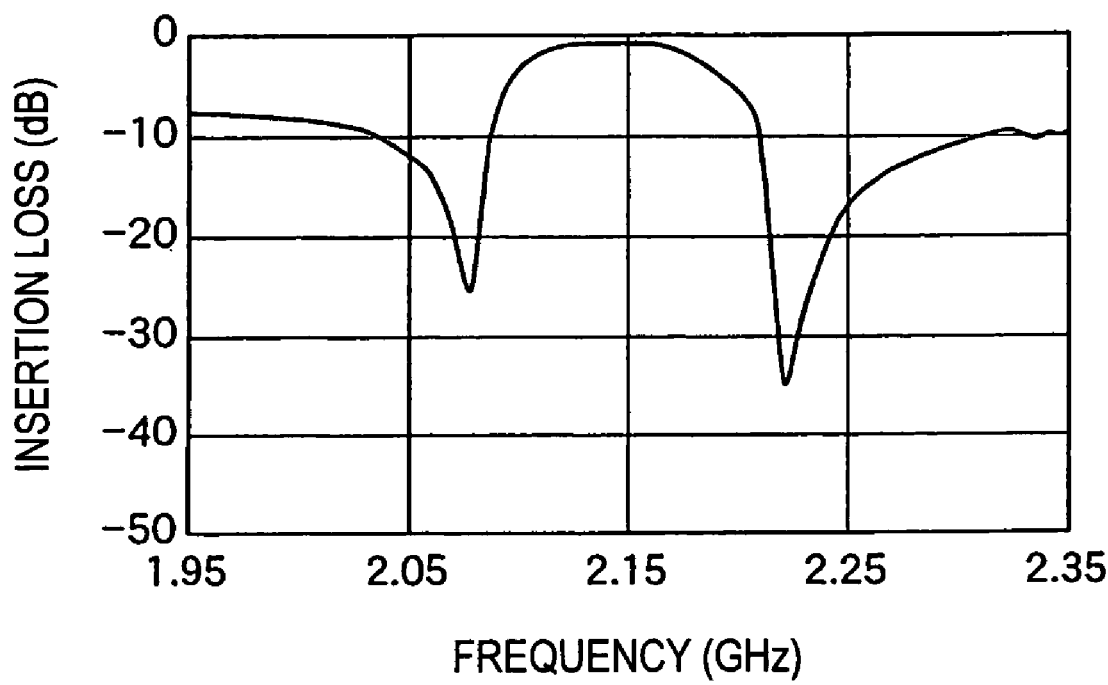
FIG. 7 is a graph illustrating the frequency characteristic of the surface acoustic wave device shown in FIG. 6.
Figure 8:
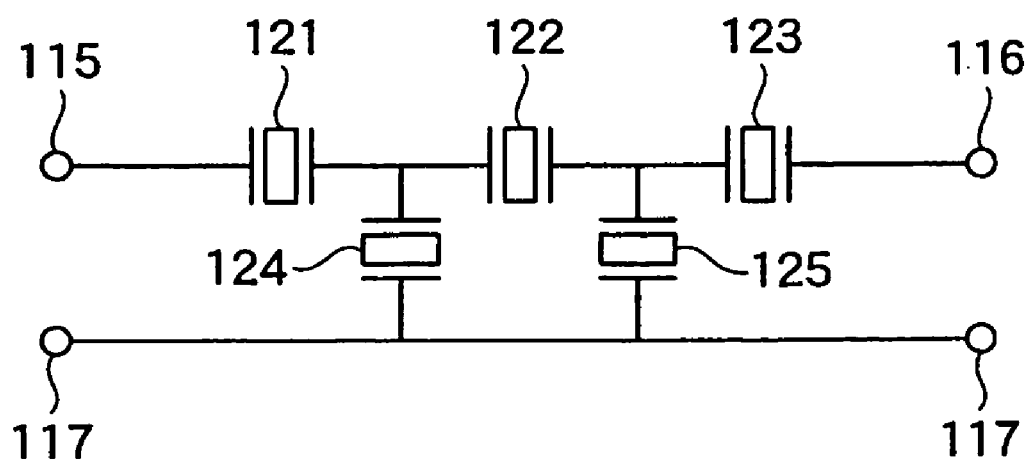
FIG. 8 is a circuit diagram illustrating an equivalent circuit of a surface acoustic wave device as a second object of consideration by the present inventors.
Figure 9:
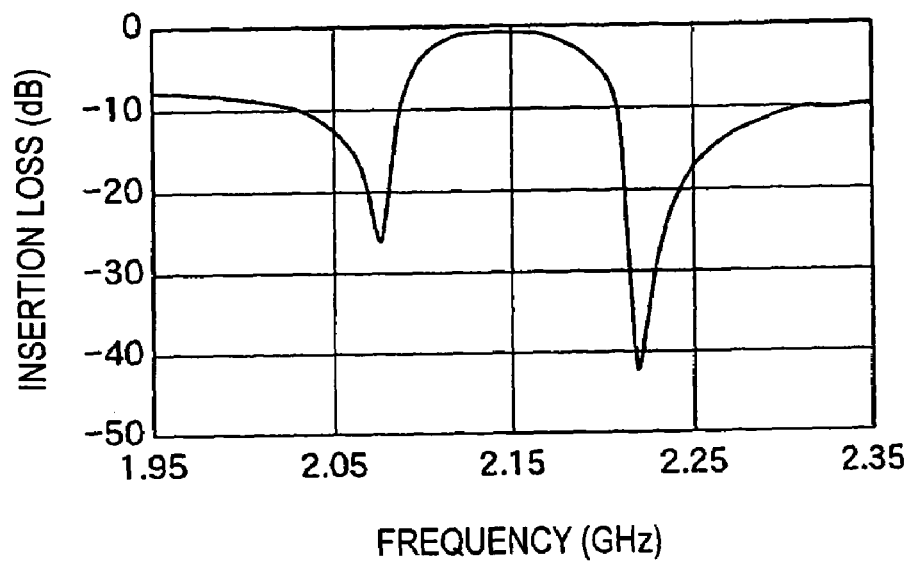
FIG. 9 is a graph illustrating the frequency characteristic of the surface acoustic wave device shown in FIG. 8.
Figure 10:
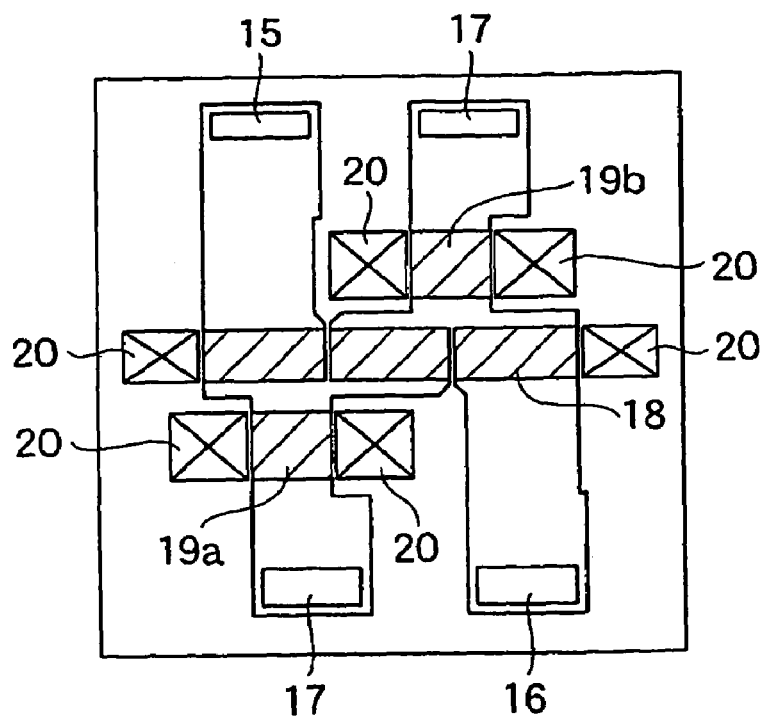
FIG. 10 is a diagram illustrating the element layout of the surface acoustic wave device shown in FIG. 6.
Figure 11:
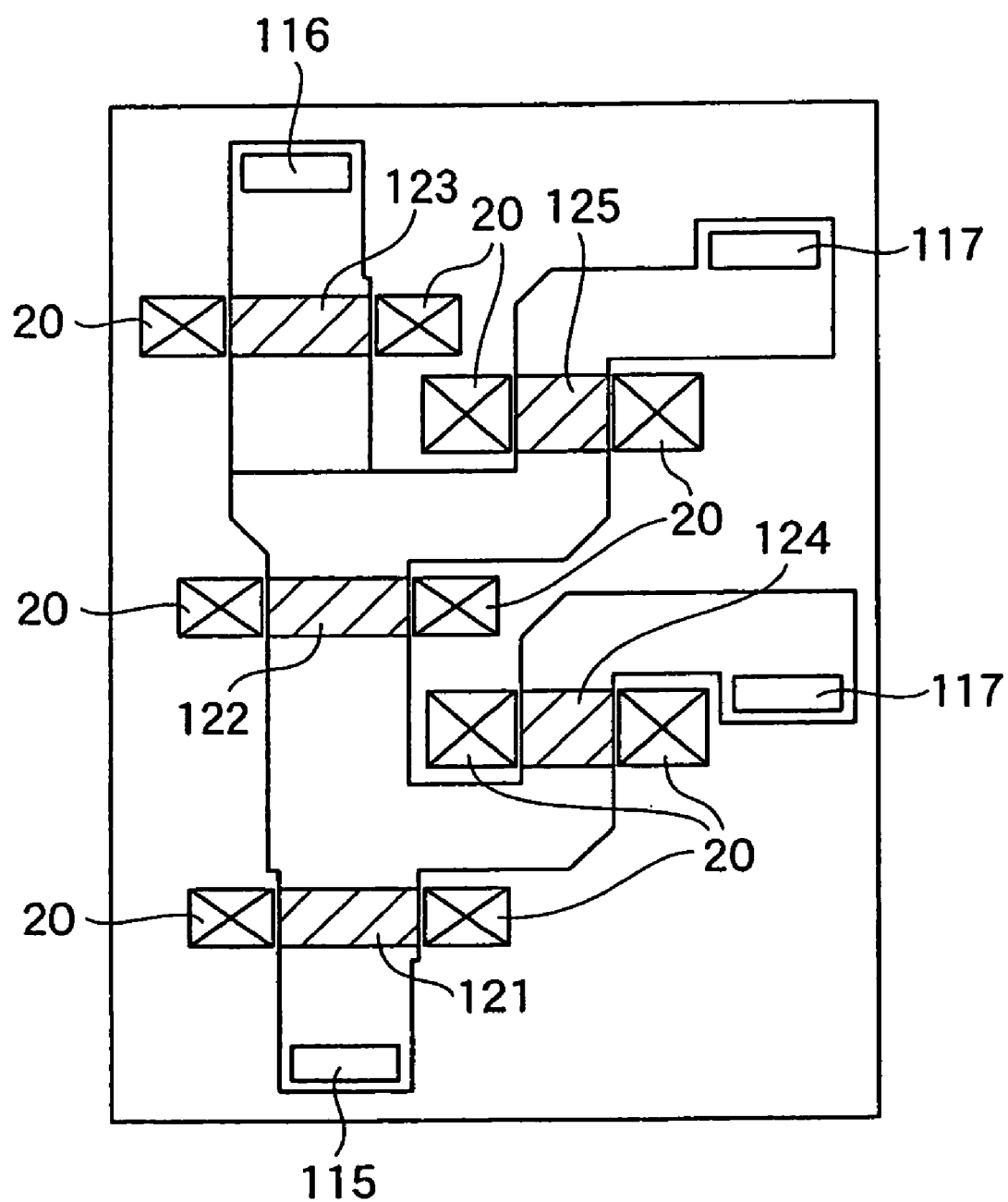
FIG. 11 is an explanatory diagram illustrating the element layout of the surface acoustic wave device shown in FIG. 8.
Figure 13:
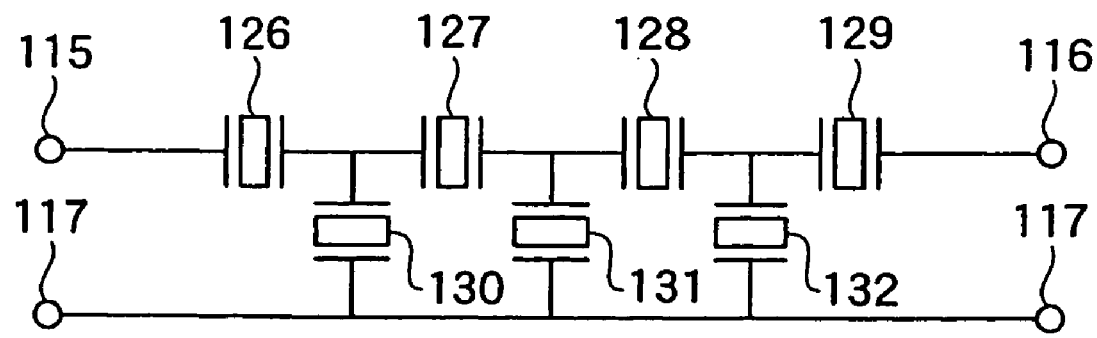
FIG. 13 is a circuit diagram illustrating an equivalent circuit of a surface acoustic wave device as a third object of consideration by the present inventors.

FIG. 6 is a circuit diagram illustrating an equivalent circuit of the surface acoustic wave device in accordance with a second embodiment of the invention. FIG. 7 is a graph illustrating the frequency characteristic of the surface acoustic wave device shown in FIG. 6. FIG. 8 is a circuit diagram illustrating an equivalent circuit of a surface acoustic wave device as a second object of consideration by the present inventors. FIG. 9 is a graph illustrating the frequency characteristic of the surface acoustic wave device shown in FIG. 8. FIG. 10 is a diagram illustrating the element layout of the surface acoustic wave device shown in FIG. 6. FIG. 11 is an explanatory diagram illustrating the element layout of the surface acoustic wave device shown in FIG. 8. FIG. 12 is a circuit diagram illustrating an equivalent circuit of the surface acoustic wave device as a modification of the second embodiment of the invention. FIG. 13 is a circuit diagram illustrating an equivalent circuit of a surface acoustic wave device as a third object of consideration by the present inventors.

It should be noted that the electronic component in which the surface acoustic wave device has been packaged is similar to the one shown in FIG. 1 in accordance with the first embodiment, including the embodiment described below.

As shown in FIG. 6, one first surface acoustic wave resonator 18 and two second surface acoustic wave resonators 19a and 19b are formed in the surface acoustic wave device in accordance with this embodiment.

Here, the first surface acoustic wave resonator 18 consists of the input terminal 18a connected to the input signal electrode 15 and having the plurality of comb electrodes, the output terminal 18b connected to the output signal electrode 16 and having the plurality of comb electrodes, and a first and a second common terminal $18c_1$ and $18c_2$ respectively having the plurality of comb electrodes. Further, an interdigital transducer A is formed by some comb electrodes of the first common terminal $18c_1$ and the comb electrodes of the input terminal 18a, and an interdigital transducer B is formed by some comb electrodes of the second common terminal $18c_2$ and the comb electrodes of the output terminal 18b. Furthermore, an interdigital transducer C is formed by the other comb electrodes of the first common terminal $18c_1$ and the other comb electrodes of the second common terminal $18c_2$.

One second surface acoustic wave resonator 19a is connected between the first common terminal $18c_1$ of the first surface acoustic wave resonator 18 and the grounding electrodes 17, while the other second surface acoustic wave resonator 19b is connected between the second common terminal $18c_2$ of the first surface acoustic wave resonator 18 and the grounding electrodes 17. It should be noted, however, that it suffices if the second surface acoustic wave resonator is connected either between the first common terminal $18c_1$ and the grounding electrodes 17, or between the second common terminal $18c_2$ and the grounding electrodes 17.

Further, a setting is provided such that the antiresonant frequencies of the second surface acoustic wave resonators 19a and 19b substantially agree with the resonant frequency of the first surface acoustic wave resonator 18.

The frequency characteristic of the surface acoustic wave device having the above-described configuration is shown in FIG. 7.

Here, an equivalent circuit of a surface acoustic wave device as a second object of consideration by the present inventors is shown in FIG. 8.

FIG. 8 is also a surface acoustic wave device of the so-called ladder type. Three surface acoustic wave resonators 121, 122, and 123 are connected in series between the input signal electrode 115 and the output signal electrode 116. Further, two surface acoustic wave resonators 124 and 125 are connected between the grounding electrodes 117 and respective midpoints between these surface acoustic wave resonators 121, 122, and 123. Namely, a total of five surface acoustic wave resonators are used in the illustrated case. Further, a setting is provided such that the antiresonant frequencies of the surface acoustic wave resonator 124 and 125 substantially agree with the resonant frequencies of the surface acoustic wave resonators 121, 122, and 123.

The frequency characteristic of the surface acoustic wave device having the configuration of FIG. 8 is shown in FIG. 9.

As can be understood through a comparison between the frequency characteristic (FIG. 7) of the surface acoustic wave device of this embodiment and the frequency characteristic (FIG. 9) of the surface acoustic wave device which is the second object of consideration, the insertion losses and the attenuation characteristics of the two devices are substantially equivalent.

As described before, only a total of three surface acoustic wave resonators including one first surface acoustic wave resonator 18 and two second surface acoustic wave resonator 19 are used in the surface acoustic wave device of this embodiment. In contrast, five surface acoustic wave resonators are used in the surface acoustic wave device which is the second object of consideration.

Accordingly, in accordance with the invention, in the first surface acoustic wave resonator 18, the input terminal 18a and the output terminal 18b having the plurality of comb electrodes are respectively connected to the input signal electrode 15 and the output signal electrode 16. Further, the second surface acoustic wave resonator 19a is connected between the grounding electrodes 17, on the one hand, and the first common terminal $18c_1$, on the other hand, which makes up the interdigital transducers together with the comb electrodes of the input terminal 18a. Furthermore, the second surface acoustic wave resonator 19b is connected between the grounding electrodes 17, on the one hand, and the second common terminal $18c_2$, on the other hand, which makes up the interdigital transducers together with the comb electrodes of the input terminal 18b. Therefore, it is possible to obtain frequency characteristics of low loss and high attenuation characteristics, while reducing the number of surface acoustic wave resonators used. As a result, it is possible to make the chip size small and make the device compact.

The element layout of the surface acoustic wave device in accordance with the invention in FIG. 6 is shown in FIG. 10. The element layout of the surface acoustic wave device as the second object of consideration in FIG. 8 is shown in FIG. 111.

As is apparent from these drawings, in the surface acoustic wave device in accordance with the invention, as compared with the surface acoustic wave device as the second object of consideration having a frequency characteristic equivalent thereto, the number of surface acoustic wave resonators used is small, so that it can be understood that the chip size is made substantially small.

Here, an equivalent circuit of the surface acoustic wave device as a modification of the second embodiment is shown in FIG. 12, and an equivalent circuit of a surface acoustic wave device as a third object of consideration by the present inventors is shown in FIG. 13.

In FIG. 12, a total of four surface acoustic wave resonators, including one first surface acoustic wave resonator 18 and three second surface acoustic wave resonators 19a, 19b, and 19c are formed.

The first surface acoustic wave resonator 18 consists of the input terminal 18a connected to the input signal electrode 15 and having the plurality of comb electrodes, the output terminal 18b connected to the output signal electrode 16 and having the plurality of comb electrodes, and first, second, and third common terminals $18c_1$, $18c_2$, and $18c_3$ respectively having the plurality of comb electrodes. Further, the interdigital transducer A is formed by some comb electrodes of the first common terminal $18c_1$ and the comb electrodes of the input terminal 18a, and the interdigital transducer B is formed by some comb electrodes of the second common terminal $18c_2$ and the comb electrodes of the output terminal 18b. Furthermore, the interdigital transducer C is formed by the other comb electrodes of the first common terminal $18c_1$ and some comb electrodes of the third common terminal $18c_3$, and an interdigital transducer D is formed by the other comb electrodes of the second common terminal $18c_2$ and the other comb electrodes of the third common terminal $18c_3$.

In addition, the three surface acoustic wave resonators 19a, 19b, and 19c are connected between the grounding electrodes 17, on the one hand, and the respective common terminals $18c_1$, $18c_2$, and $18c_3$ Of the first surface acoustic wave resonator 18, on the other hand. However, it suffices if the second surface acoustic wave resonator is provided between at least one common terminal and the grounding electrodes.

In FIG. 13, four surface acoustic wave resonators 126, 127, 128, and 129 are connected in series between the input signal electrode 115 and the output signal electrode 116. Further, three surface acoustic wave resonators 130, 131, and 132 are connected between the grounding electrodes 117 and respective midpoints between these surface acoustic wave resonators 126, 127, 128, and 129. Namely, a total of seven surface acoustic wave resonators are used.

The surface acoustic wave device in accordance with the invention shown in FIG. 12 and the surface acoustic wave device which is the third object of consideration shown in FIG. 13 also have equivalent frequency characteristics.

Thus, in the invention, in a case where the number of common terminals making up the first surface acoustic wave resonator 18 has increased, it suffices if the second surface acoustic wave resonator is connected between the common terminal and the grounding electrodes.

Incidentally, it is possible to expand the third common terminal. Namely, a plurality of third common terminals can be provided. In this case, an interdigital transducer is formed by some comb electrodes of one third common terminal and some comb electrodes of another third common terminal. Consequently, respective ones of the input terminal 18a, the first common terminal $18c_1$, the plurality of third common terminals $18c_3$, the second common terminal $18c_2$, and the output terminal 18b are coupled via the interdigital transducers.

(Third Embodiment)

Figure 14:
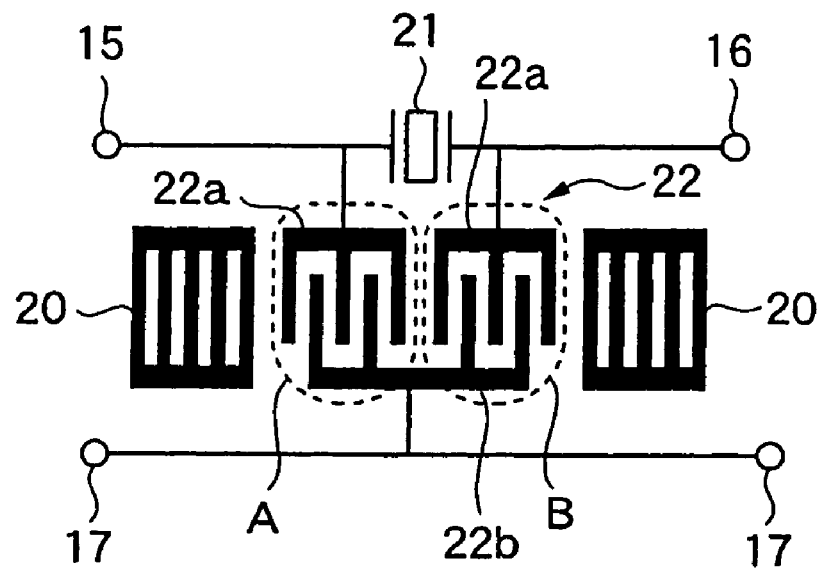
FIG. 14 is a circuit diagram illustrating an equivalent circuit of the surface acoustic wave device in accordance with a third embodiment of the invention.
Figure 15:
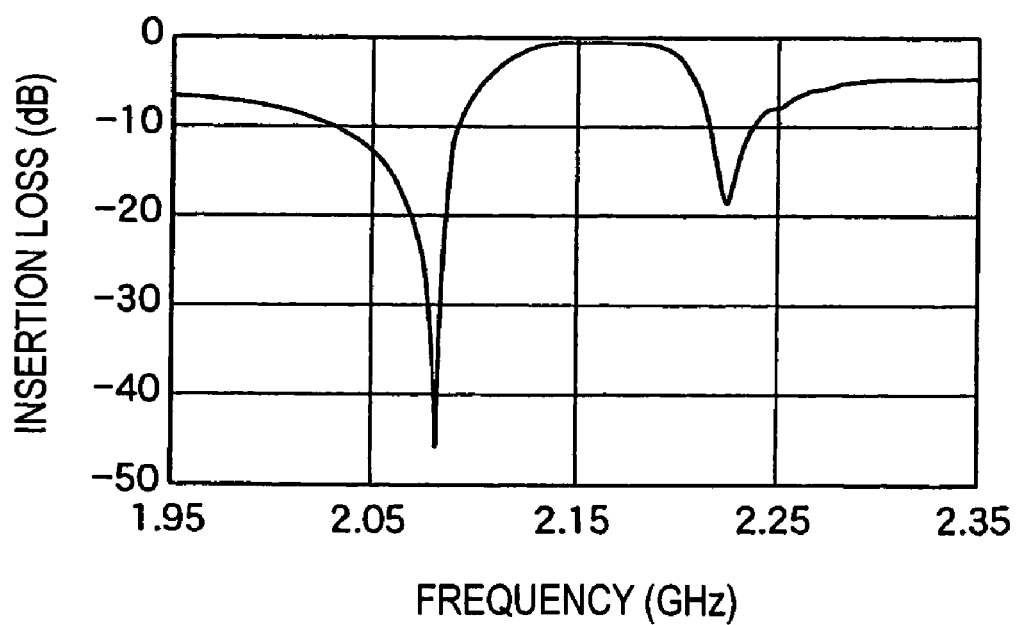
FIG. 15 is a graph illustrating the frequency characteristic of the surface acoustic wave device shown in FIG. 14.
Figure 16:
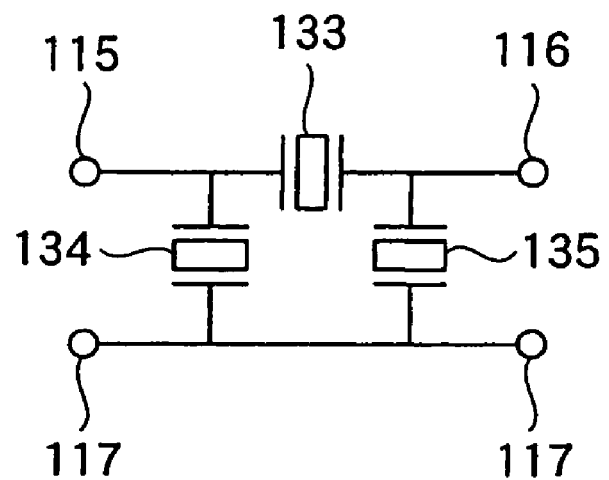
FIG. 16 is a circuit diagram illustrating an equivalent circuit of a surface acoustic wave device as a fourth object of consideration by the present inventors.
Figure 17:
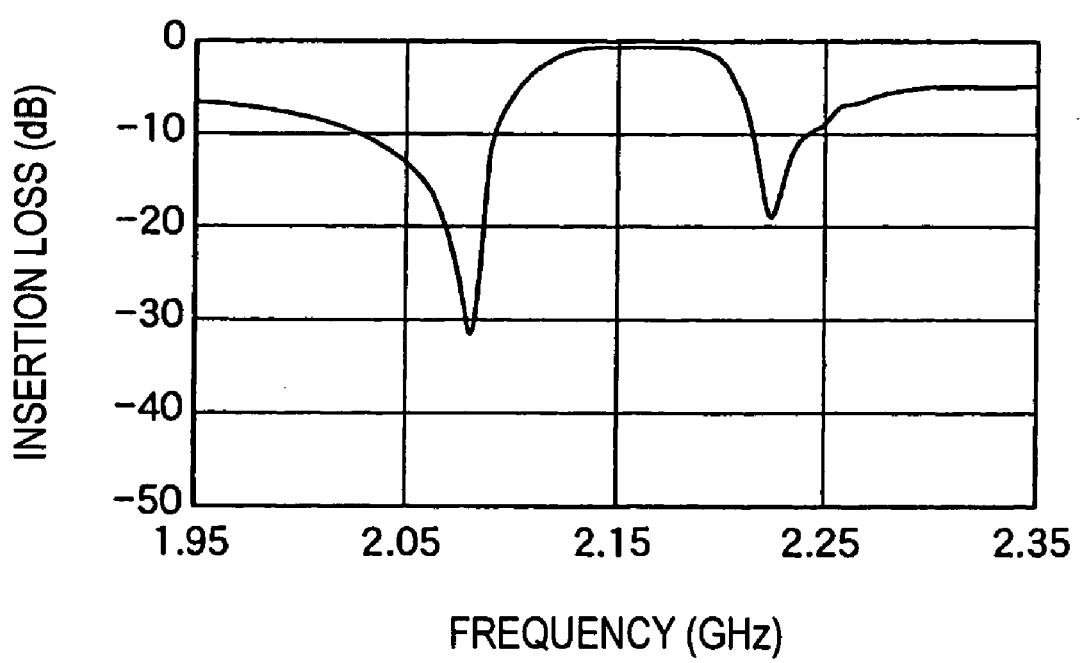
FIG. 17 is a graph illustrating the frequency characteristic of the surface acoustic wave device shown in FIG. 16.
Figure 18:
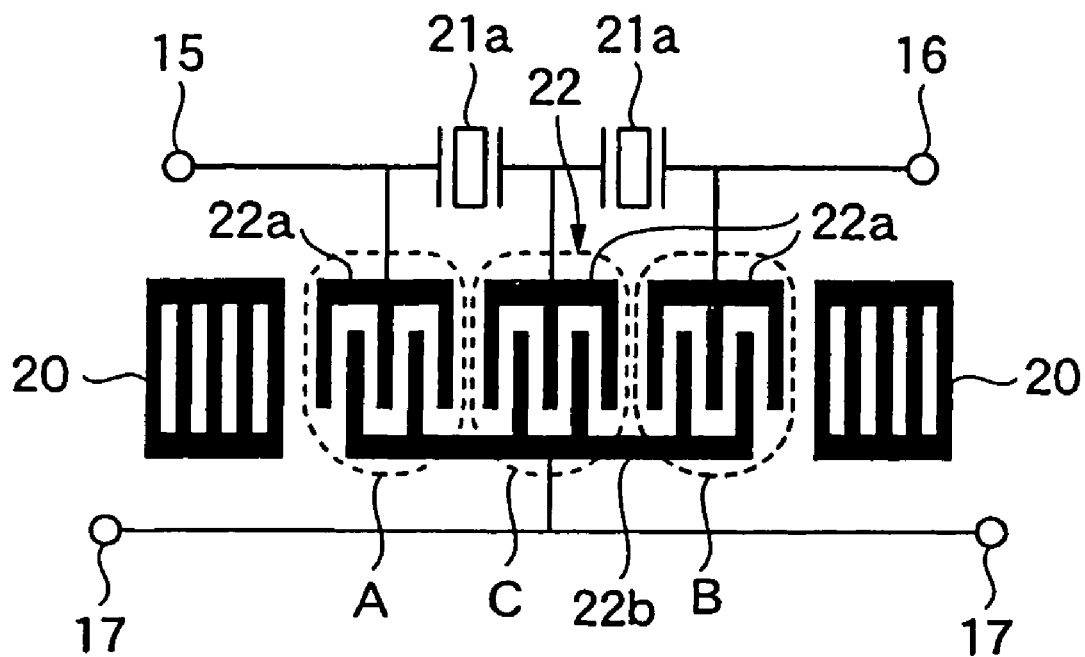
FIG. 18 is a circuit diagram illustrating an equivalent circuit of the surface acoustic wave device as a first modification of the third embodiment of the invention.
Figure 19:
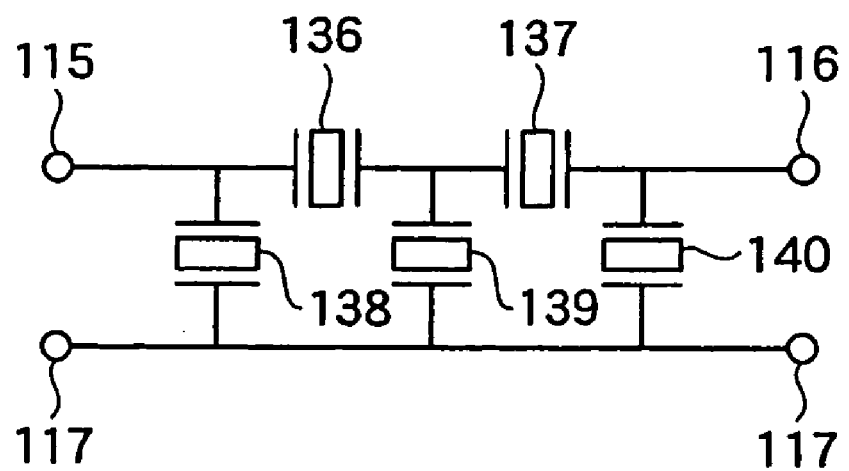
FIG. 19 is a circuit diagram illustrating an equivalent circuit of a surface acoustic wave device as a fifth object of consideration by the present inventors.
Figure 20:
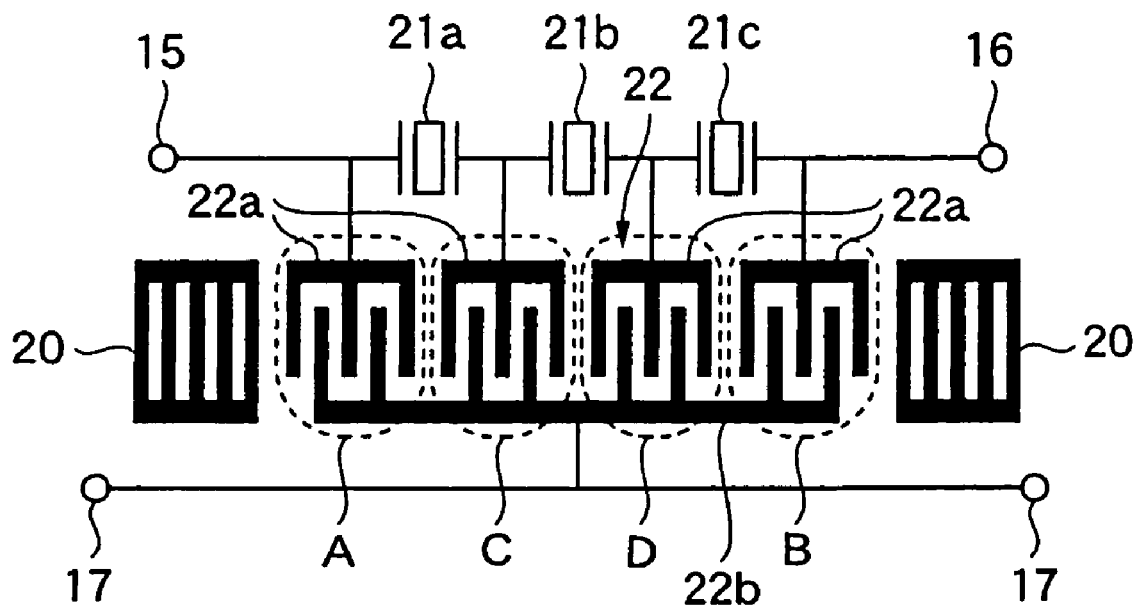
FIG. 20 is a circuit diagram illustrating an equivalent circuit of the surface acoustic wave device as a second modification of the third embodiment of the invention.
Figure 21:
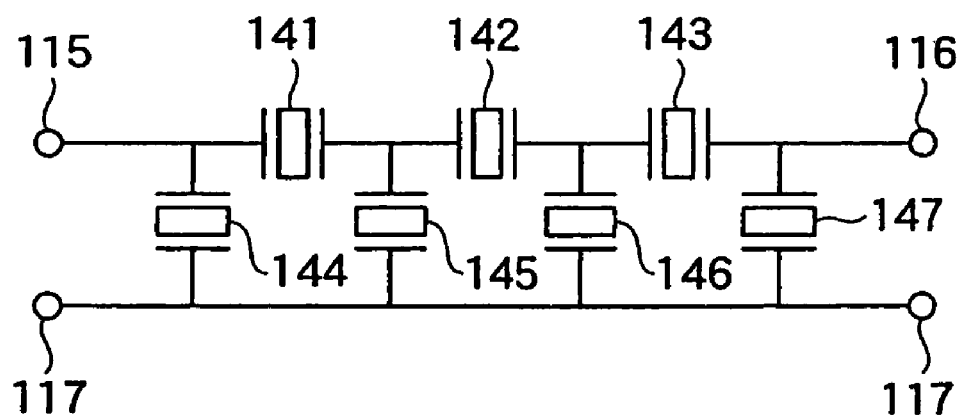
FIG. 21 is a circuit diagram illustrating an equivalent circuit of a surface acoustic wave device as a sixth object of consideration by the present inventors.

FIG. 14 is a circuit diagram illustrating an equivalent circuit of the surface acoustic wave device in accordance with a third embodiment of the invention. FIG. 15 is a graph illustrating the frequency characteristic of the surface acoustic wave device shown in FIG. 14. FIG. 16 is a circuit diagram illustrating an equivalent circuit of a surface acoustic wave device as a fourth object of consideration by the present inventors. FIG. 17 is a graph illustrating the frequency characteristic of the surface acoustic wave device shown in FIG. 16. FIG. 18 is a circuit diagram illustrating an equivalent circuit of the surface acoustic wave device as a first modification of the third embodiment of the invention. FIG. 19 is a circuit diagram illustrating an equivalent circuit of a surface acoustic wave device as a fifth object of consideration by the present inventors. FIG. 20 is a circuit diagram illustrating an equivalent circuit of the surface acoustic wave device as a second modification of the third embodiment of the invention. FIG. 21 is a circuit diagram illustrating an equivalent circuit of a surface acoustic wave device as a sixth object of consideration by the present inventors.

As shown in FIG. 14, a third surface acoustic wave resonator and a fourth surface acoustic wave resonator 22 which resonate with the surface acoustic wave of a predetermined frequency are formed in the surface acoustic wave device in accordance with this embodiment.

Here, the third surface acoustic wave resonator 21 is connected between the input signal electrode 15 and the output signal electrode 16. It should be noted that the number of electrodes and the aperture width of each interdigital transducer making up the third surface acoustic wave resonator 21 can be set freely.

In addition, the fourth surface acoustic wave resonator 22 consists of two (a plurality of) signal-side terminals 22a respectively having the plurality of comb electrodes and connected to a midpoint between the input signal electrode 15 and the third surface acoustic wave resonator 21 and a midpoint between the output signal electrode 16 and the third surface acoustic wave resonator 21, as well as a ground-side terminal 22b having the plurality of comb electrodes to form interdigital transducers by these comb electrodes and the comb electrodes of the respective signal-side terminals 22a and connected to the grounding electrodes 17. Here, one interdigital transducer A is formed by the comb electrodes of one signal-side terminal 22a and some comb electrodes of the ground-side terminal 22b, while the other interdigital transducer B is formed by the comb electrodes of the other signal-side terminal 22a and the other comb electrodes of the ground-side terminal 22b. It should be noted that the reflectors 20 for reflecting the surface acoustic wave are respectively disposed on both sides of the fourth surface acoustic wave resonator 22 (the reflectors on the third surface acoustic wave resonator 21 side are not shown).

Further, a setting is provided such that the antiresonant frequency of the fourth surface acoustic wave resonator 22 substantially agrees with the resonant frequency of the third surface acoustic wave resonator 21.

In addition, although the electrode periods and the numbers of pairs of the interdigital transducers A and B of the fourth surface acoustic wave resonator 22 are set to identical values in this embodiment, different electrode periods and different numbers of pairs may be used. Further, the aperture width need not completely agree, and may be different.

Figure 23:
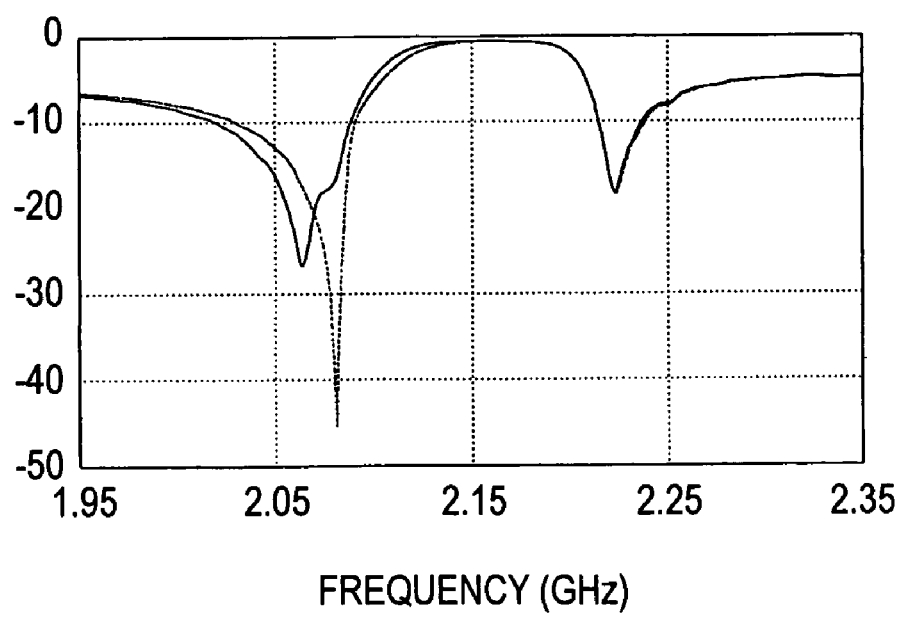
FIG. 23 is a frequency characteristic of the surface acoustic wave device if electrode periods are made different in the case of FIG. 14.

For example, in FIG. 14, if a electrode period of the interdigital transducer B is made different from a electrode period of the interdigital transducer A (see FIG. 24), passing band can be widened. FIG. 23 shows a frequency characteristic of the surface acoustic wave device in that an electrode period of the interdigital transducer A is set to λ and an electrode period of the interdigital transducer B is set to 0.99λ (or 1.01λ). In FIG. 23, a broken line indicates a frequency characteristic when both electrode periodes of the transducers A and B are identical each other. As apparent from FIG. 23, it is preferable that the passing band is widened at low frequency side when the electrode periodes are differentiated. The difference of electrode periodes is appropriately adjustable in accordance with necessitated characteristic. The ratio of the period is not limited to 0.99 or 1.01. In the case of three or more interdigital transducers are arranged as shown in FIG. 18 or 20, it is clearly understandable that the electrode period can be independently set irrespective of the others.

Furthermore, the electrode periods may be alternately identical or different in relationship with the interdigital transducers making up the third surface acoustic wave resonator 21, or any ones of the electrode periods may be identical. However, to obtain desirable frequency characteristics, the electrode period of the interdigital transducers making up the fourth surface acoustic wave resonator 22 is preferably set to be greater than the electrode period of the interdigital transducers making up the third surface acoustic wave resonator 21.

The frequency characteristic of the surface acoustic wave device having the above-described configuration is shown in FIG. 15.

Here, an equivalent circuit of a surface acoustic wave device as a fourth object of consideration by the present inventors is shown in FIG. 16.

FIG. 16 is a surface acoustic wave device of the so-called ladder type. One surface acoustic wave resonator 133 is connected between the input signal electrode 115 and the output signal electrode 116. Further, two surface acoustic wave resonators 134 and 135 are respectively connected in parallel between the grounding electrodes 117 and a midpoint between the input signal electrode 115 and the surface acoustic wave resonator 122 and between the grounding electrodes 117 and a midpoint between the output signal electrode 116 and the surface acoustic wave resonator 122. Namely, a total of three surface acoustic wave resonators are used in the illustrated case. Further, a setting is provided such that the antiresonant frequencies of the surface acoustic wave resonators 134 and 135 substantially agree with the resonant frequency of the surface acoustic wave resonator 133.

The frequency characteristic of the surface acoustic wave device having the configuration of FIG. 16 is shown in FIG. 17.

As can be understood through a comparison between the frequency characteristic (FIG. 15) of the surface acoustic wave device of this embodiment and the frequency characteristic (FIG. 17) of the surface acoustic wave device which is the fourth object of consideration, the insertion losses and the attenuation characteristics of the two devices are substantially equivalent.

As described before, only two surface acoustic wave resonators including the third surface acoustic wave resonator 21 and the fourth surface acoustic wave resonator 22 are used in the surface acoustic wave device of this embodiment. In contrast, three surface acoustic wave resonators are used in the surface acoustic wave device which is the fourth object of consideration.

Thus, in accordance with the invention, in the fourth surface acoustic wave resonator 22, the signal-side terminals 22a having the plurality of comb electrodes are respectively connected to the midpoint between the input signal electrode 15 and the third surface acoustic wave resonator 21 and the midpoint between the output signal electrode 16 and the third surface acoustic wave resonator 21. The interdigital transducers are formed by the comb electrodes of the ground-side terminal 22b and the comb electrodes of the respective signal-side terminals 22a, and the ground-side terminal 22b and the grounding electrodes 17 are connected. Therefore, it is possible to obtain frequency characteristics of low loss and high attenuation characteristics, while reducing the number of surface acoustic wave resonators used. As a result, it is possible to make the chip size small and make the device compact.

Here, a description will be given of the form of connection in a case where a plurality of third surface acoustic wave resonators are used, through a comparison with the surface acoustic wave device which is used as an object of consideration.

First, in a case where two third surface acoustic wave resonators 21a and 21b are used, these third surface acoustic wave resonators 21a and 21b are connected in series between the input signal electrode 15 and the output signal electrode 16, as shown in FIG. 18.

In addition, the fourth surface acoustic wave resonator 22 consists of three (a plurality of) signal-side terminals 22a respectively having the plurality of comb electrodes and connected to the midpoint between the input signal electrode 15 and one third surface acoustic wave resonator 21a, the midpoint between the output signal electrode 16 and the other third surface acoustic wave resonator 21b, and the midpoint between the third surface acoustic wave resonator 21a and the third surface acoustic wave resonator 21b, as well as the ground-side terminal 22b having the plurality of comb electrodes to form interdigital transducers by these comb electrodes and the comb electrodes of the respective signal-side terminals 22a and connected to the grounding electrodes 17. Here, the interdigital transducers A, B, and C are respectively formed by the signal-side terminals 22a and portions of the ground-side terminal 22b.

A surface acoustic wave device as a fifth object of consideration having a frequency characteristic equivalent to that of the surface acoustic wave device having the above-described configuration is shown in FIG. 19.

In FIG. 19, two surface acoustic wave resonators 136 and 137 are connected in series between the input signal electrode 115 and the output signal electrode 116. Further, three surface acoustic wave resonators 138, 139, and 140 are respectively connected in parallel between the grounding electrodes 117 and the midpoint between the input signal electrode 115 and the surface acoustic wave resonator 136, between the grounding electrodes 117 and the midpoint between the surface acoustic wave resonator 136 and the surface acoustic wave resonator 137, and between the grounding electrodes 117 and the midpoint between the output signal electrode 116 and the surface acoustic wave resonator 137. Namely, a total of five surface acoustic wave resonators are used in the illustrated case.

As is apparent from a comparison between FIG. 18 illustrating the surface acoustic wave device in accordance with the invention and FIG. 19 illustrating the surface acoustic wave device which is the fifth object of consideration, in order to obtain predetermined frequency characteristics, three surface acoustic wave resonators (the third surface acoustic wave resonators 21a and 21b and the fourth surface acoustic wave resonator 22) are required in the former case, whereas five surface acoustic wave resonator 136 to 140 are required in the latter case.

Next, in a case where three third surface acoustic wave resonators 21a, 21b, and 21c are used, these third surface acoustic wave resonators 21a, 21b, and 21c are connected in series between the input signal electrode 15 and the output signal electrode 16, as shown in FIG. 20.

In addition, the fourth surface acoustic wave resonator 22 consists of four (a plurality of) signal-side terminals 22a respectively having the plurality of comb electrodes and connected to the midpoint between the input signal electrode 15 and the third surface acoustic wave resonator 21a, the midpoint between the output signal electrode 16 and the third surface acoustic wave resonator 21b, the midpoint between the third surface acoustic wave resonator 21a and the third surface acoustic wave resonator 21b, and the midpoint between the third surface acoustic wave resonator 21b and the third surface acoustic wave resonator 21c, as well as the ground-side terminal 22b having the plurality of comb electrodes to form interdigital transducers by these comb electrodes and the comb electrodes of the respective signal-side terminals 22a and connected to the grounding electrodes 17. Here, the interdigital transducers A, B, C, and D are respectively formed by the signal-side terminals 22a and portions of the ground-side terminal 22b.

Thus, in the case where the third surface acoustic wave resonators which are connected in series between the input signal electrode 15 and the output signal electrode 16 have increased, it suffices if signal-side terminals which are respectively connected to midpoints between adjacent ones of the third surface acoustic wave resonators are increased in number.

A surface acoustic wave device as a sixth object of consideration having a frequency characteristic equivalent to that of the surface acoustic wave device having the above-described configuration is shown in FIG. 21.

In FIG. 21, three surface acoustic wave resonators 141, 142, and 143 are connected in series between the input signal electrode 115 and the output signal electrode 116. Further, four surface acoustic wave resonators 144, 145, 146, and 147 are respectively connected in parallel between the grounding electrodes 117 and the midpoint between the input signal electrode 115 and the surface acoustic wave resonator 141, between the grounding electrodes 117 and the midpoint between the surface acoustic wave resonator 141 and the surface acoustic wave resonator 142, between the grounding electrodes 117 and the midpoint between the surface acoustic wave resonator 142 and the surface acoustic wave resonator 143, and between the grounding electrodes 117 and the midpoint between the output signal electrode 116 and the surface acoustic wave resonator 143. Namely, a total of seven surface acoustic wave resonators are used in the illustrated case.

As is apparent from a comparison between FIG. 20 illustrating the surface acoustic wave device in accordance with the invention and FIG. 21 illustrating the surface acoustic wave device which is the sixth object of consideration, in order to obtain predetermined frequency characteristics, four surface acoustic wave resonators (the third surface acoustic wave resonators 21a, 21b, and 21c and the fourth surface acoustic wave resonator 22) are required in the former case, whereas seven surface acoustic wave resonator 141 to 147 are required in the latter case.

The invention devised by the present inventors has been described above through its embodiments, but inductance elements can be respectively connected between the grounding electrodes 17 and the aforementioned surface acoustic wave resonators 19, 19a, 19b, and 19c. In addition, an inductance element can be connected also between the grounding electrodes 17 and the ground-side terminal 22b of the fourth surface acoustic wave resonator 22. If such an arrangement is provided, it is possible to obtain greater spurious response attenuation, so that the frequency characteristic improves further.

In addition, a plurality of surface acoustic wave devices of this application can be connected, or a surface acoustic wave device having another configuration can be connected to the surface acoustic wave device of this application.

The surface acoustic wave device of the invention is suitable for a filter, particularly a filter for a branching filter using a plurality of filters. Moreover, the surface acoustic wave device of the invention is also suitable for a composite filter having a plurality of passbands with mutually different band center frequencies. In these cases, it suffices if at one of the surface acoustic wave devices is the surface acoustic wave device in accordance with the invention.

However, the scope of application of the invention is not limited to the filter, and may be applied to various surface acoustic wave devices other than the field of filters in which a plurality of surface acoustic wave resonators are mounted.

It should be noted that a one-terminal pair surface acoustic wave resonator and a two-terminal pair surface acoustic wave resonator are disclosed on page 217 of "*Danseisoshi Gijutsu Handobukku* (Handbook of Elastic Component Technology)" (Ohmsha, Ltd., published on Nov. 30, 1991).

In addition, a surface acoustic wave filter combining a one-terminal pair surface acoustic wave resonator and a two-terminal pair surface acoustic wave resonator is disclosed in JP-A-5-48055, for example. A configuration in which a one-terminal pair surface acoustic wave resonator and a two-terminal pair surface acoustic wave resonator are connected in series is disclosed therein.

In contrast, in this application, in the first surface acoustic wave resonator 18, the input terminal 18a and the output terminal 18b having the plurality of comb electrodes are respectively connected to the input signal electrode 15 and the output signal electrode 16. Furthermore, the second surface acoustic wave resonator 19 is connected between the grounding electrodes 17, on the one hand, and the common terminal 18c, on the other hand, which has the plurality of comb electrodes and makes up the interdigital transducers together with the input terminal 18a and the output terminal 18b. In addition, in the fourth surface acoustic wave resonator 22, the signal-side terminal 22 having the plurality of comb electrodes is connected to the midpoint between the input signal electrode 15 and the third surface acoustic wave resonator 21 and the midpoint between the output signal electrode 16 and the third surface acoustic wave resonator 21. In a case where a plurality of third surface acoustic wave resonators are provided, the signal-side terminal 22 having the plurality of comb electrodes is connected to midpoints between adjacent ones of the third surface acoustic wave resonators, the interdigital transducers are formed by the comb electrodes of the signal-side terminals 22a and the ground-side terminal 22b having the plurality of comb electrodes, and the ground-side terminal 22b is connected to the grounding electrodes 17.

The above-described configurations are not even suggested in the aforementioned documents, and have been disclosed for the first time by this application.

As is apparent from the foregoing description, the following advantages are offered in accordance with the invention.

The number of surface acoustic wave resonators required can be reduced, and the connection line length necessary for electrical connection can be made short. Therefore, it is possible to obtain frequency characteristics of low loss and high attenuation characteristics, while reducing the number of surface acoustic wave resonators used.

As a result, it becomes possible to make the chip size small and make the device compact.

What is claimed is:

1. A surface acoustic wave device comprising:
    an input signal electrode and an output signal electrode to and from which an electric signal is inputted or outputted;
    a first surface acoustic wave resonator including:
        an input terminal connected to the input signal electrode and having a plurality of comb electrodes;
        an output terminal connected to the output signal electrode and having a plurality of comb electrodes; and
        common conductor means which has a plurality of comb electrodes and a part of comb electrodes of which form an interdigital transducer together with the comb electrodes of the input terminal, and the other part of the comb electrodes of which form an interdigital transducer together with the comb electrodes of the output terminal; and
    a second surface acoustic wave resonator connected between a grounding electrode and at least one of the common terminals of the first surface acoustic wave resonator.

2. The surface acoustic wave device according to claim 1, wherein said common conductor means includes a plurality of common terminals, each having a plurality of comb electrodes, and a third interdigital transducer is formed by a part of the comb electrodes of one common terminal and a part of the comb electrodes of another common terminal.

3. The surface acoustic wave device according to claim 1, wherein the electrode period of the interdigital transducer forming the second surface acoustic wave resonator is set to be greater than the electrode period of the plurality of interdigital transducers forming the first surface acoustic wave resonator.

4. The surface acoustic wave device according to claim 1, wherein an inductance element is connected between the second surface acoustic wave resonator and the grounding electrode.

5. A branching filter comprising:
   at least two surface acoustic wave devices having mutually different band center frequencies, and at least one of the surface acoustic wave devices comprising:
   an input signal electrode and an output signal electrode to and from which an electric signal is inputted or outputted;
   a first surface acoustic wave resonator including:
      an input terminal connected to the input signal electrode and having a plurality of comb electrodes;
      an output terminal connected to the output signal electrode and having a plurality of comb electrodes; and
      common conductor means which has a plurality of comb electrodes and a part of comb electrodes of which form an interdigital transducer together with the comb electrodes of the input terminal, and the other part of the comb electrodes of which form an interdigital transducer together with the comb electrodes of the output terminal; and
   a second surface acoustic wave resonator connected between a grounding electrode and at least one of the common terminals of the first surface acoustic wave resonator.

6. The surface acoustic wave device according to claim 1, wherein an electrode period of the first interdigital transducers of the first surface acoustic wave resonator is different from an electrode period of the second interdigital transducers the first surface acoustic wave resonator.

7. The surface acoustic wave device according to claim 1, wherein an electrode period of the first interdigital transducers of the first surface acoustic wave resonator is identical to an electrode period of the second interdigital transducers of the first surface acoustic wave resonator.

8. The surface acoustic wave device according to claim 1, wherein an electrode period of the plurality of interdigital transducers forming the first surface acoustic wave resonator is different from an electrode period of an interdigital transducer forming the second surface acoustic wave resonator.

* * * * *